United States Patent
Lim et al.

(10) Patent No.: US 7,763,958 B1
(45) Date of Patent: Jul. 27, 2010

(54) LEADFRAME PANEL FOR POWER PACKAGES

(75) Inventors: Peng Soon Lim, Melaka (MY); Terh Kuen Yii, Kuala Lumpur (MY); Sek Hoi Chong, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 384 days.

(21) Appl. No.: 11/754,070

(22) Filed: May 25, 2007

(51) Int. Cl.
*H01L 23/495* (2006.01)
*H01L 23/48* (2006.01)

(52) U.S. Cl. .................. 257/666; 257/670; 257/676; 257/690; 257/E23.01; 257/E23.031

(58) Field of Classification Search .............. 257/666, 257/670, 676, 690, E23.01, E23.031
See application file for complete search history.

(56) References Cited

U.S. PATENT DOCUMENTS

| | | | |
|---|---|---|---|
| 5,446,313 A * | 8/1995 | Masuda et al. | 257/666 |
| 5,508,232 A * | 4/1996 | Ueda et al. | 29/827 |
| 5,977,613 A * | 11/1999 | Takata et al. | 257/666 |
| 6,130,473 A | 10/2000 | Mostafazadeh et al. | |
| 6,750,546 B1 | 6/2004 | Villanueva et al. | |
| 6,777,788 B1 | 8/2004 | Wan et al. | |
| 6,924,549 B2 * | 8/2005 | Nose et al. | 257/676 |
| RE39,854 E | 9/2007 | Mostafazadeh et al. | |
| 7,342,297 B1 * | 3/2008 | Tan et al. | 257/666 |
| 7,470,978 B2 * | 12/2008 | Tan et al. | 257/666 |
| 2002/0038714 A1 | 4/2002 | Glenn | |
| 2002/0079561 A1 | 6/2002 | Yasunaga et al. | |
| 2003/0178748 A1 | 9/2003 | Bolken et al. | |
| 2004/0157372 A1 * | 8/2004 | Manatad | 438/108 |
| 2004/0232541 A1 * | 11/2004 | Son et al. | 257/696 |
| 2007/0075409 A1 * | 4/2007 | Letterman et al. | 257/678 |
| 2007/0170600 A1 | 7/2007 | Nishimura et al. | |
| 2008/0096319 A1 * | 4/2008 | Hwa et al. | 438/112 |
| 2008/0265384 A1 * | 10/2008 | Dirks | 257/670 |
| 2009/0026590 A1 * | 1/2009 | Lim et al. | 257/670 |

FOREIGN PATENT DOCUMENTS

| | | | |
|---|---|---|---|
| EP | 646961 A2 * | 4/1995 | |
| JP | 63086461 A * | 4/1988 | |
| WO | WO 2006090304 A1 * | 8/2006 | |

OTHER PUBLICATIONS

Hwa et al., U.S. Appl. No. 10/831,537 entitled "Sawn Power Package and Method of Fabricating Same," filed Apr. 22, 2004.

(Continued)

*Primary Examiner*—Fernando L Toledo
*Assistant Examiner*—John P Dulka
(74) *Attorney, Agent, or Firm*—Beyer Law Group LLP

(57) ABSTRACT

An improved leadframe panel suitable for use in packaging IC dice for use in power applications is described. The described leadframe panel enables more efficient means of encapsulation and singulation as compared with a conventional power leadframe panel. Additionally, a thin IC power package is described that enables increased package heat dissipation, the use of a larger die attach pad as well as the use of a larger die as compared with conventional power devices.

20 Claims, 7 Drawing Sheets

OTHER PUBLICATIONS

Li et al., U.S. Appl. No. 11/552,879 entitled "Integrated Circuit Package," filed Oct. 25, 2006.

Amkor SOIC/SSOP package data sheet from www.amkor.com, rev. date Dec. 2005.

Annotated Drawings produced by Examiner Peniel M. Gumedzoe using drawings from 2002/0038714 (Glenn), cited in an Office Action dated Dec. 22, 2009 from U.S. Appl. No. 11/781,788.

* cited by examiner

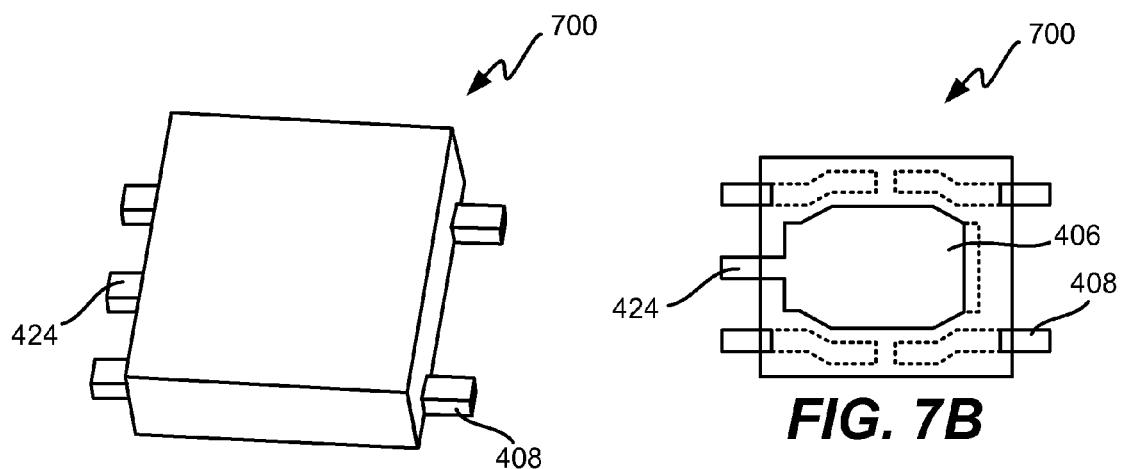
FIG. 7A
FIG. 7B
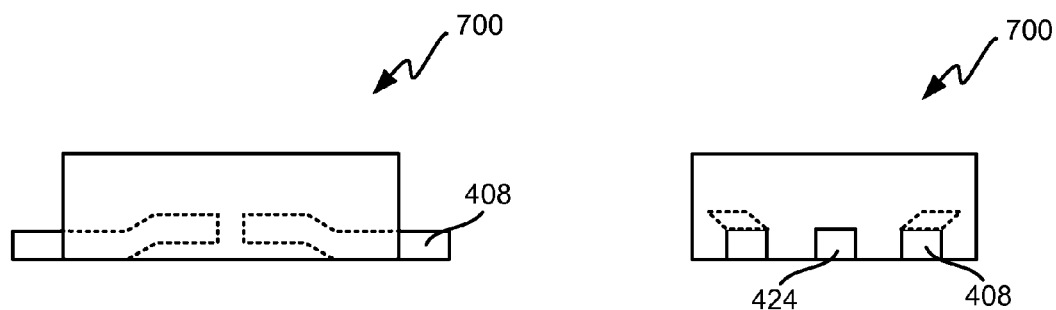
FIG. 7C
FIG. 7D

LEADFRAME PANEL FOR POWER PACKAGES

TECHNICAL FIELD

The present invention relates generally to the packaging of integrated circuits (ICs). More particularly, a high density leadframe panel suitable for use in packaging IC dice for use in power applications is described.

BACKGROUND OF THE INVENTION

The packaging of integrated circuit (IC) devices configured for use in power applications, (e.g. IC devices designed to transport and/or regulate electrical power), presents challenges unique from those faced when packaging conventional IC dice not configured for use in power applications. By way of example, IC power packages generally conduct more current and produce more thermal energy than their conventional non-power related counterparts. Additionally, the size and spacing of the leads is generally more restricted in power packages.

The encapsulation of IC power packages has conventionally been performed on an individual device area level. More particularly, a mold cavity is placed over a leadframe panel. The mold cavity generally includes a number of mold runners that are used to guide molding material to individual device areas of the leadframe panel. The singulation of IC power packages has conventionally been accomplished via known trim and forming methods. In these methods, a custom-tooled die is used to punch the encapsulated packages out from the leadframe panel. Subsequently, the leads are generally formed to a desired configuration, again employing custom tooling.

Although the aforementioned methods are effective in producing IC devices for use in power applications, there are continuing efforts to develop more efficient methods and apparatuses.

SUMMARY OF THE INVENTION

In one embodiment, a leadframe panel suitable for use in packaging integrated circuit dice is described. The leadframe panel includes a two dimensional array of device areas arranged in a plurality of columns. Each column includes a plurality of immediately adjacent device areas. Each device area is configured for use in a semiconductor die power package. Each device area, in turn, includes a plurality of leads and a die attach pad. A plurality of intermediate tie bars extend substantially parallel to the columns of device areas. Each tie bar is positioned between a pair of associated adjacent columns of device areas. All of the leads and the die attach pads in each intermediate column of devices areas are carried only by the adjacent pair of associated intermediate tie bars.

In another embodiment, an integrated circuit (IC) power package is described. The power package includes a power IC die. The die has an active surface and a back surface. The active surface of the die includes a plurality of bond pads. The package also includes a lead frame having a die attach pad and a plurality of leads. The back surface of the die is affixed to the top surface of the die attach pad. The die attach pad is characterized in that middle portions of the die attach pad are elongated along principal axes relative to side portions of the die attach pad. Each lead has an inner portion proximal to the die attach pad and an outer portion distal to the die attach pad. The inner portions of at least the outermost leads of the package are vertically upset relative to the associated outer portion of such leads and the die attach pad. In this way, the top surface of each inner portion is higher than a top surface of the associated outer portion of the lead and higher than the top surface of the associated die attach pad. Additionally, the inner portions of at least the outermost leads of the package are laterally offset relative to the associated outer portions of such leads such that each outermost lead bends around an end of the die attach pad to a side of the die attach pad and proceeds a length along the side. The bottom surfaces of the outer portions of the leads are substantially coplanar with the bottom surface of the die attach pad.

The package additionally includes electrical connections that electrically connect bond pads of the die to top surfaces of the inner portions of the leads. Finally, the package includes molding material that encapsulates portions of the die, die attach pad, leads and electrical connections while leaving the bottom surface of the die attach pad and bottom surfaces of the outer portions of the leads exposed on a bottom surface of the package.

BRIEF DESCRIPTION OF THE DRAWINGS

For a better understanding of the invention, reference should be made to the following detailed description taken in conjunction with the accompanying drawings, in which:

FIGS. 7A-7D illustrate diagrammatic perspective, bottom, front and side views of an IC package in accordance with a particular embodiment of the present invention.

Like reference numerals refer to corresponding parts throughout the drawings.

DETAILED DESCRIPTION OF THE DRAWINGS

The present invention relates generally to the packaging of integrated circuits (ICs). More particularly, a high density leadframe panel suitable for use in packaging IC dice for use in power applications is described.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Particular embodiments of the present invention provide for a high density power leadframe panel suitable for use in packaging IC dice for use in power applications that enables more efficient means of encapsulation and singulation while reducing the amounts of both wasted molding material and leadframe material as compared with a conventional power leadframe panel. Additionally, particular embodiments of the power leadframe panel are described in the context of a packaging process that enables a thinner package profile while allowing for increased package heat dissipation, a larger die attach pad as well as a larger die as compared with conventional power devices.

Examples of currently available power packages include National Semiconductor Corporation's Single Chip (SC) and Standard Outline Transistor (SOT) package families. These packages are generally used in power applications necessitating both portability and miniature size. The SC70 and SOT23 packages are surface mount devices (SMDs), or devices that are intended to be mounted directly to surface contacts of a printed circuit board (PCB). By way of example, SC70 and SOT23 packages are mainly used for power modules, temperature sensors and audio amplifier products.

Figure 1:
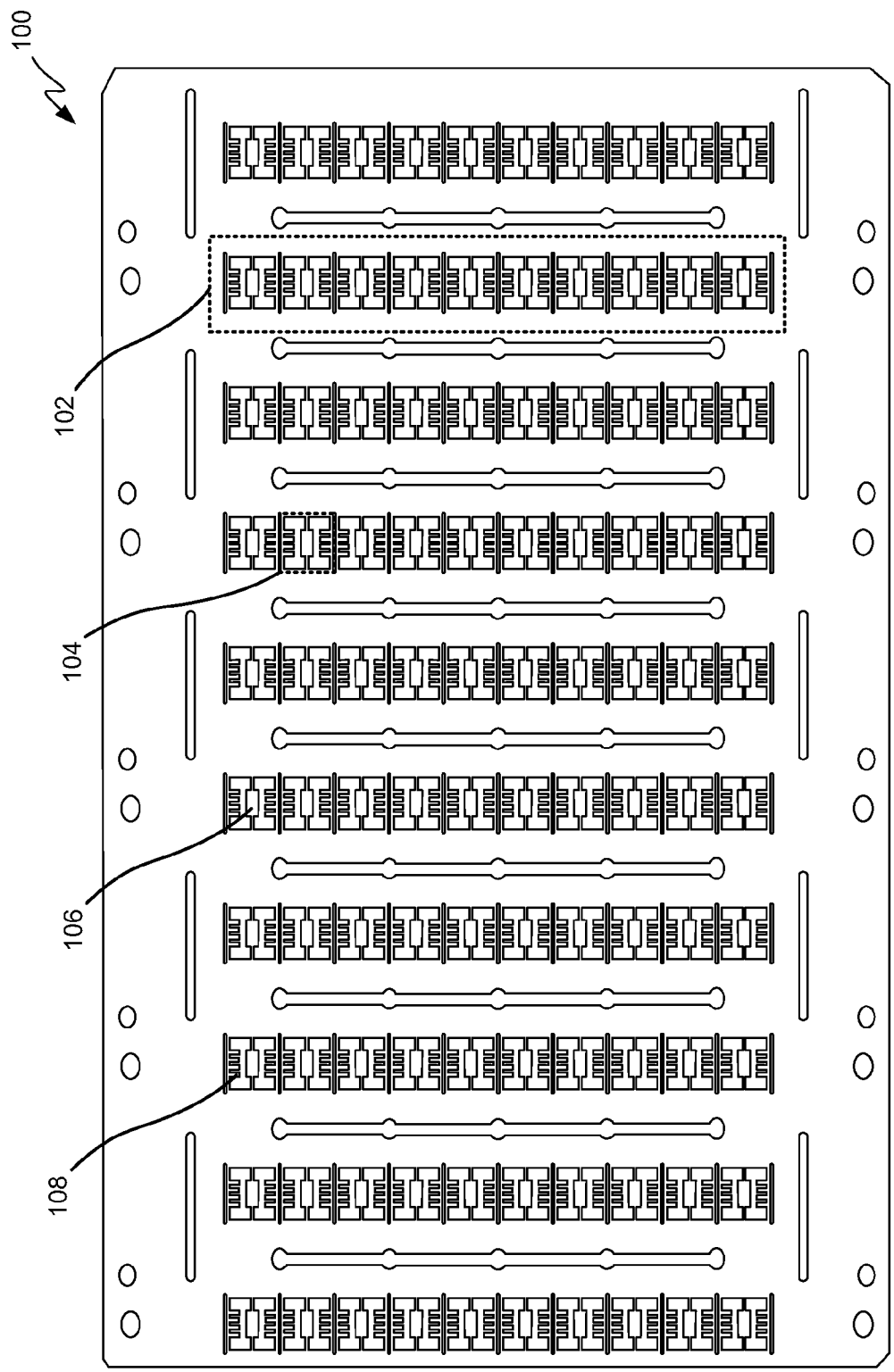
FIG. 1 illustrates a diagrammatic top view of a conventional leadframe panel suitable for use in packaging IC dice for use in power applications.

FIG. 1 illustrates a top perspective view of one example of a conventional leadframe panel 100 suitable for use in packaging IC dice for use in power applications. The leadframe panel 100 includes a plurality of columns 102 of device areas 104. Each device area 104 includes a die attach pad 106 and a number of leads 108. By way of example, FIG. 1 illustrates a leadframe panel having three leads 108 on each of two opposite sides of an associated die attach pad 106. Each of the leads 108 is orientated parallel with its associated column 102.

The encapsulation of the device areas 104 is generally accomplished via a mold cavity having top and bottom portions. When positioned about a leadframe panel, the top and bottom portions cooperate to form a main central mold runner cavity, a plurality of individual device area mold cavities and associated individual mold runner channels coupling the central mold runner cavity to the individual device area mold cavities. In general, the central mold runner cavity is positioned in between two columns 102 of device areas 104 in the leadframe panel 100 such that the individual device area mold cavities are positioned over associated device areas in the leadframe panel. More particularly, the mating surfaces of the individual device area mold cavities may be positioned onto dam bars. During the encapsulation process, molding material is injected into the central mold runner cavity where it then enters the individual mold runner channels and ultimately the individual device area cavities.

Figure 2:
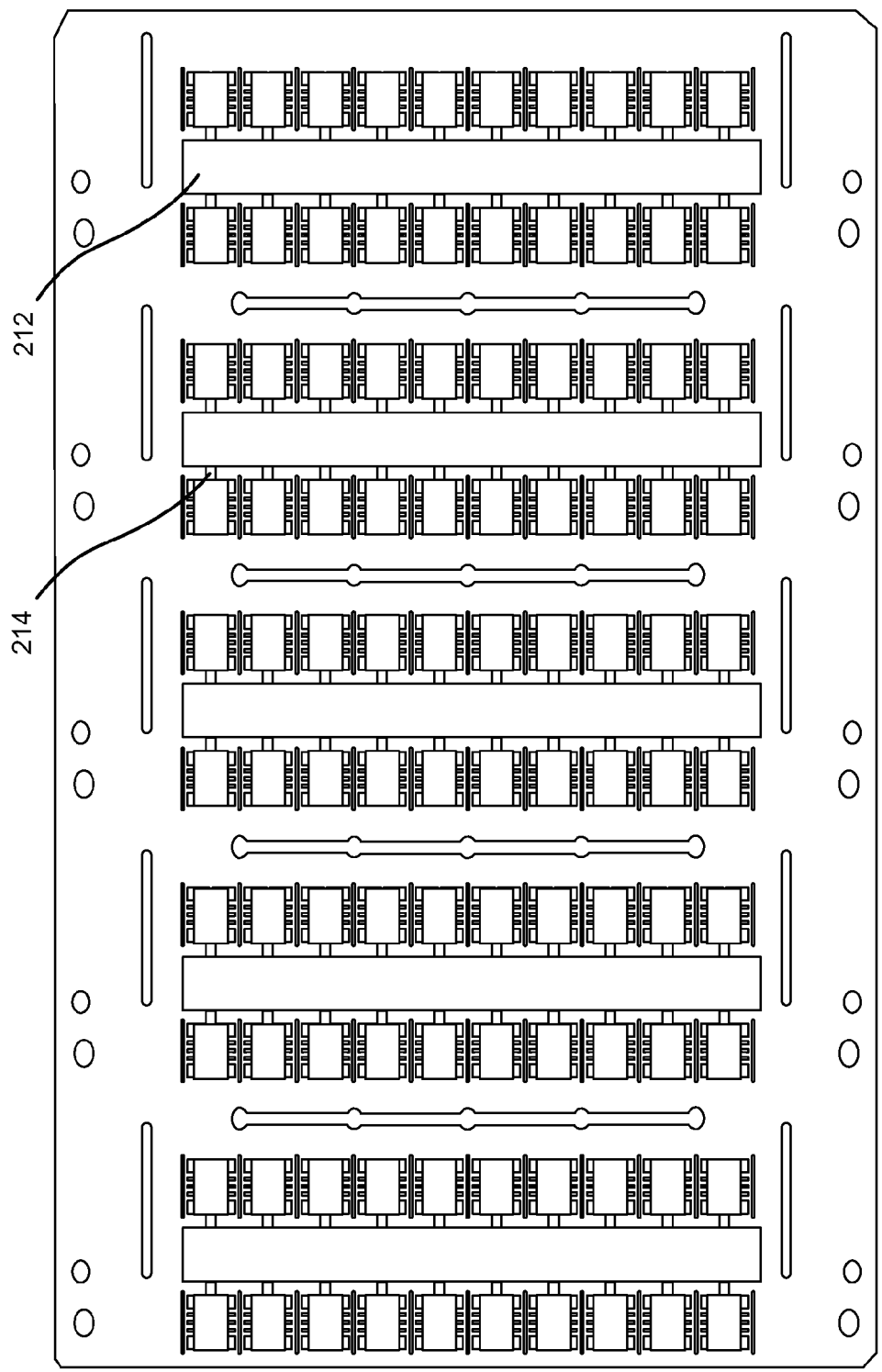
FIG. 2 illustrates a diagrammatic top view of the conventional leadframe panel of FIG. 1 after encapsulation with a molding material.

Upon curing of the molding material, the mold cavity is removed leaving behind the encapsulated leadframe, as is illustrated in FIG. 2. It will be appreciated that this and similar processes waste significant amounts of molding material. In particular, central mold runner 212 and individual mold runners 214 represent significant quantities of wasted molding material. Additionally, the aforementioned leadframe panel arrangement wastes significant space and consequently leadframe material as well, at least as a result of the space necessitated by the central mold runner cavity and individual mold runner channels. By way of example, in some conventional leadframe panel arrangements the device areas may account for only approximately 50% of the total leadframe panel footprint.

The singulation of IC power packages has traditionally been accomplished via known trim and forming methods. In these methods, a custom-tooled die is used to punch encapsulated packages 205 out from the leadframe panel. More particularly, the custom-tooled die is used to punch out the encapsulated die attach pad 106 and leads 108 from the rest of the leadframe panel 100. Subsequently, the leads are shaped into a desired configuration, again employing custom tooling. By way of example, the leads 108 are often bent into a conventional gull-wing formation to facilitate electrical connection to a PCB. Such custom tooling is expensive, and is generally only applicable for one package configuration. Each time a different package configuration is to be singulated, new custom tooling is required. It should be appreciated that the described leadframe panel arrangement and method of encapsulation prevent the use of more efficient methods of singulation such as sawing or gang-cutting (sawing using multiple parallel sawblades simultaneously).

Figure 3:
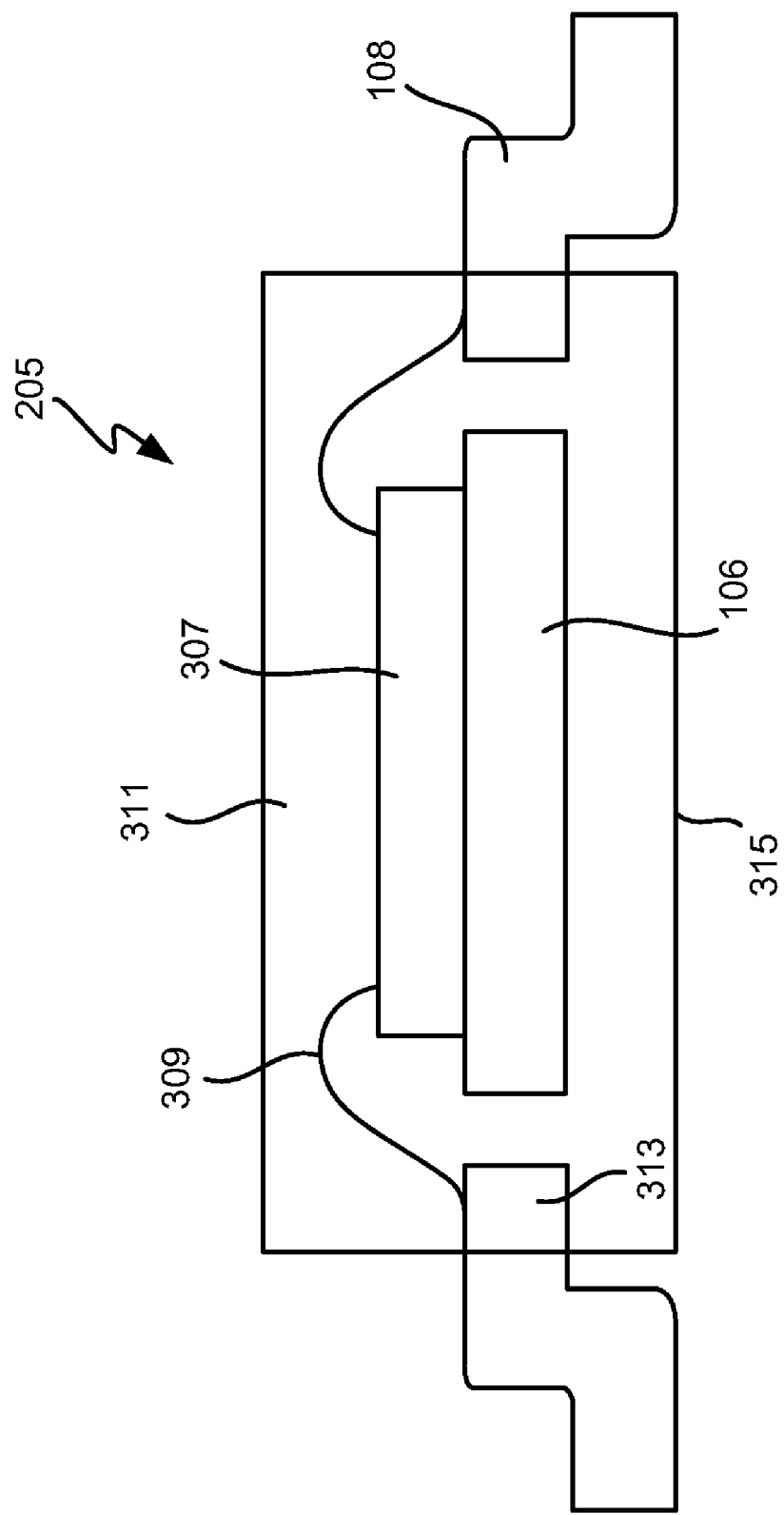
FIG. 3 illustrates a diagrammatic side view of a conventional IC package.

FIG. 3 illustrates a diagrammatic side view of a conventional package 205 resulting from the singulation of the encapsulated leadframe panel of FIG. 2. The back surface of a die 307 is attached to the top surface of the die attach pad 106. Bond pads on the active surface of the die are electrically connected to top surfaces of the leads with bonding wires 309. In this package design, the entire die 307 and associated die attach pad 106, including the bottom surface of the die attach pad, are generally encapsulated with molding material 311. The partially encapsulated leads 108 extend entirely from the sides of the package 205. In this way, bottom surfaces 313 of the portions of the leads 108 that extend immediately from the sides of the package 205 are not coplanar with the bottom surface 315 of the package. Hence, the leads 108 are shaped into a conventional gull-wing formation to facilitate electrical connection with contacts on a PCB.

Figure 4A:
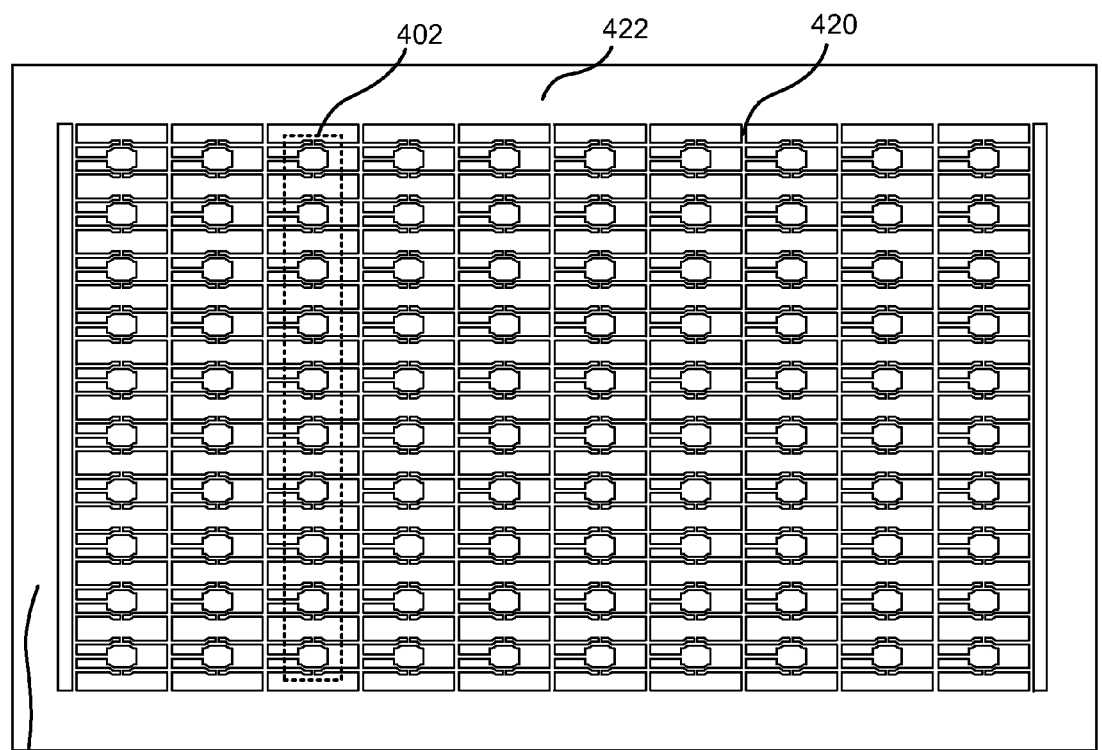
FIG. 4 illustrates a diagrammatic top view of a leadframe panel in accordance with a particular embodiment of the present invention.
Figure 4B:
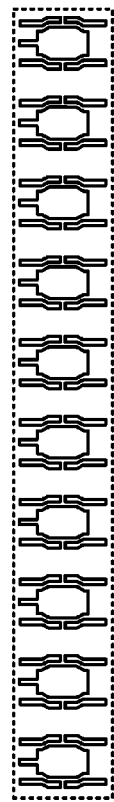

Particular embodiments of the present invention will now be described with reference to FIGS. 4-7. FIG. 4A illustrates a diagrammatic top view of a high density leadframe panel 400 arranged in the form of a strip. The leadframe panel 400 can be configured as a metallic structure with a number of immediately adjacent columns 402 of device areas. As illustrated in the successively more detailed FIGS. 4B-4C, each column 402 includes a plurality of immediately adjacent device areas 404, each configured for use in packaging a single dual inline IC package (DIP). By way of example, in the illustrated embodiment, each column 402 of the leadframe panel 400 includes four device areas 404. However, it should be appreciated that the number of device areas 404 in each column 402 may vary widely. By way of example, there may be more than five, ten or more device areas 404 in any one column 402.

The number of device area columns 402 may vary widely. Preferably, the lead frame panel 400 includes at least three such columns 402, and even more columns are generally preferred. In the illustrated embodiment, all of the components of each device area 404 are carried by an associated pair of tie bars 420. Each tie bar 420 extends substantially parallel to the columns 402 of device areas 404 between a pair of associated adjacent columns of device areas. Side rails 422 provide a rigid frame from which the tie bars 420 are supported. In some alternative embodiments, some components of the device areas 404 in the two outermost columns 402 may be suspended by the adjacent end rails 418. Additionally, it should be appreciated that in alternative embodiments, other appropriate structures may be used to carry the outer components of the device areas in the outermost columns.

In one alternate embodiment, a lead frame strip or panel may be arranged to include a plurality of two dimensional arrays of device areas 404, with each two dimensional array including a multiplicity of the columns 402.

The components of each device area 404 include a die attach pad 406 and a plurality of leads 408. In the illustrated embodiment, each die attach pad 406 is supported by a single support bar 424 that extends from one of the columnar tie bars 420 adjacent the device area 404. Additionally, each of the leads 408 extends from one of the associated columnar tie bars 420 adjacent the device area 404. In the illustrated embodiment, each device area 404 includes four leads 408, two on each of the opposing sides of the associated column 402. The leads 408 serve as electrical interconnects to facilitate later connection of the packaged device to external devices, such as a printed circuit board (PCB). In this way, all of the leads 408 and die attach pads 406 of the device areas 404 of a particular column 402 are carried only by the pair of associated tie bars 420 adjacent the device areas.

Figure 4C:
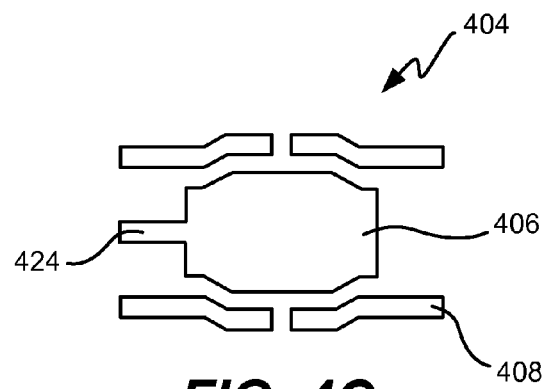

In the illustrated embodiment, the inner portions of the leads 408 (those portions of the leads proximal to the die attach pad 406) are laterally offset from associated outer portions of the leads (those portions of the leads distal to the die attach pad), as is best seen in FIG. 4C. More particularly, the leads 408 are initially directed (using the outer portions of the leads as a reference point) towards the die attach pad 406. At some distance from the die attach pad 406, the leads change direction laterally so as to proceed around the die attach pad. By way of example, the innermost portions of the leads 408 may be laterally offset from the outermost portions of the leads by a distance in the range of approximately 0.1 to 0.3 mm. The lateral offsetting of the leads 408 provides locking features that secure the leads within the resultant package upon encapsulation of the leads with a molding material, as well as enabling the use of a larger die attach pad 406. More particularly, laterally offsetting the leads 408 allows the use of a larger die attach pad 406 while maintaining a desired separation between the leads and the die attach pad so as to avoid crosstalk and other interference between the die attach pad and leads.

As will be appreciated by those skilled in the art, most die attach pads are rectangular as viewed from above. To better take advantage of the lateral offsetting of the leads 408, the die attach pad 406 may be shaped to better conform to the profile of the surrounding leads, as illustrated in FIG. 4C. By way of example, rather than being shaped in the conventional rectangular form, middle portions of the die attach pad 406 may be elongated along one or both principal axes of the die attach pad relative to side portions of the die attach pad. In this way, the die attach pad 406 may take the form of, by way of example, a cross or elongated octagon, although many other shapes are permitted and lie within the spirit and scope of the present invention. In this manner, the described die attach pad 406 and lead 408 arrangement may allow the production of a package incorporating a die whose footprint is as great as or greater than 1.5 times the footprint of a die used in a conventional package having substantially the same package footprint.

The aforementioned features of the leadframe panel 400 may be formed with any suitable means. By way of example, the features (e.g., die attach pads 406, leads 408 and tie bars 420) may be formed by stamping or etching a metallic sheet formed from a suitable conductive material.

Additionally, in particular embodiments, the leads 408 and die attach pad 406 may be etched, half-etched, or otherwise thinned relative to the bottom surface of the leadframe panel 400. By way of example, it may also be advantageous to etch locking features into the side and bottom surfaces of the leads 408. Such locking features may be later filled with molding material and aid in securing the leads 408 into the resultant package. Additionally, portions of the bottom surface of the die attach pad 406 may be half-etched so as to provide locking features or other desirable features.

In a preferred embodiment, the inner portions of the leads 408 are vertically offset (upset) relative to the bottommost surfaces of the die attach pad 406 and outer portions of the leads of the leadframe panel 400. By way of example, the inner portions of the leads 408 may be vertically upset relative to the outer portions of the leads by a distance in the range of approximately 0.1 to 0.2 mm. In one preferred embodiment, the leads 408 are vertical upset by a distance of approximately 4 mils (0.1 mm). By way of reference, the thickness of the leads 408 and die attach pad 406 may be in the range of approximately 0.1 to 0.2 mm. The vertical upsetting of the leads 408 may be accomplished by means of a suitable stamp. Similar to the lateral offsetting described above, the vertical upsetting of the inner portions of the leads 408 provides locking features that will secure the leads within a resultant package upon encapsulation of the leads with a molding material.

At least one of the leads 408 of each associated device area 404 is configured for use as a high power lead. By way of example, a high power lead may transmit signals having wattages in the range of approximately 0 to 10 W. In other embodiments, two or more of the leads of each device area may be configured for use as high power leads. In some applications, power signals may also carry high voltages. By way of example, high voltage signals may carry voltages in the range of approximately 0 to 100 V. In these high voltage applications, it becomes even more important that the leads 408 be sufficiently distanced apart so as to avoid crosstalk and other interference between the leads. By way of example, the leads are preferably separated from each other and all other conductive components of the leadframe device area by a distance of at least approximately 0.1 mm.

It will be appreciated by those skilled in the art that, although a specific leadframe panel 400 has been described and illustrated, variations exist that lie within the spirit and scope of the present invention. Additionally, although described with reference to a bottom surface of the leadframe panel 400, it should be appreciated that this context is intended solely for use in describing the structure and in no way defines or limits the orientation of the leadframe for subsequent attachment to a PCB.

Figure 5:
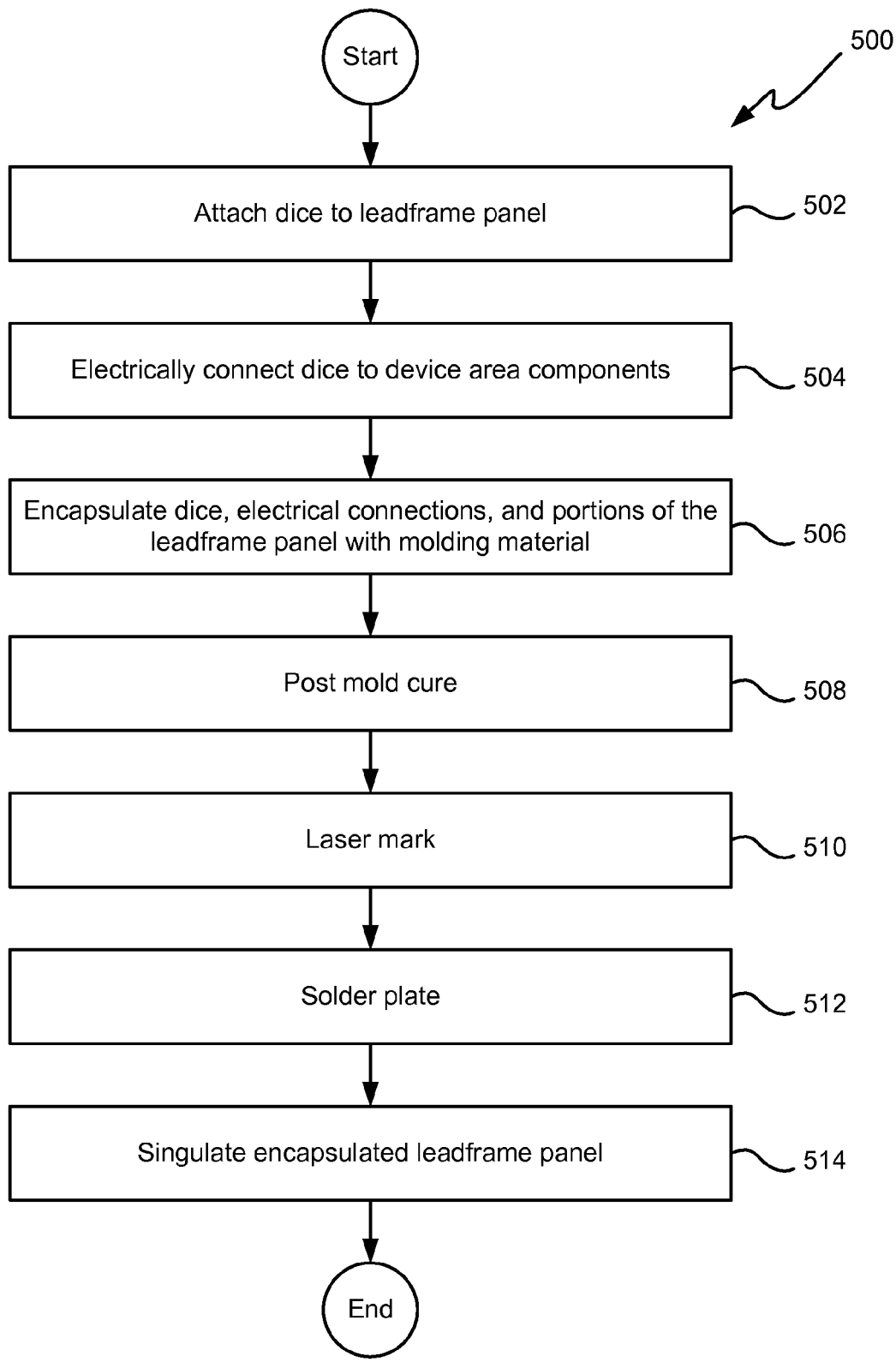
FIG. 5 is a flow chart illustrating a process for packaging IC dice in accordance with a particular embodiment of the present invention.
Figure 6:
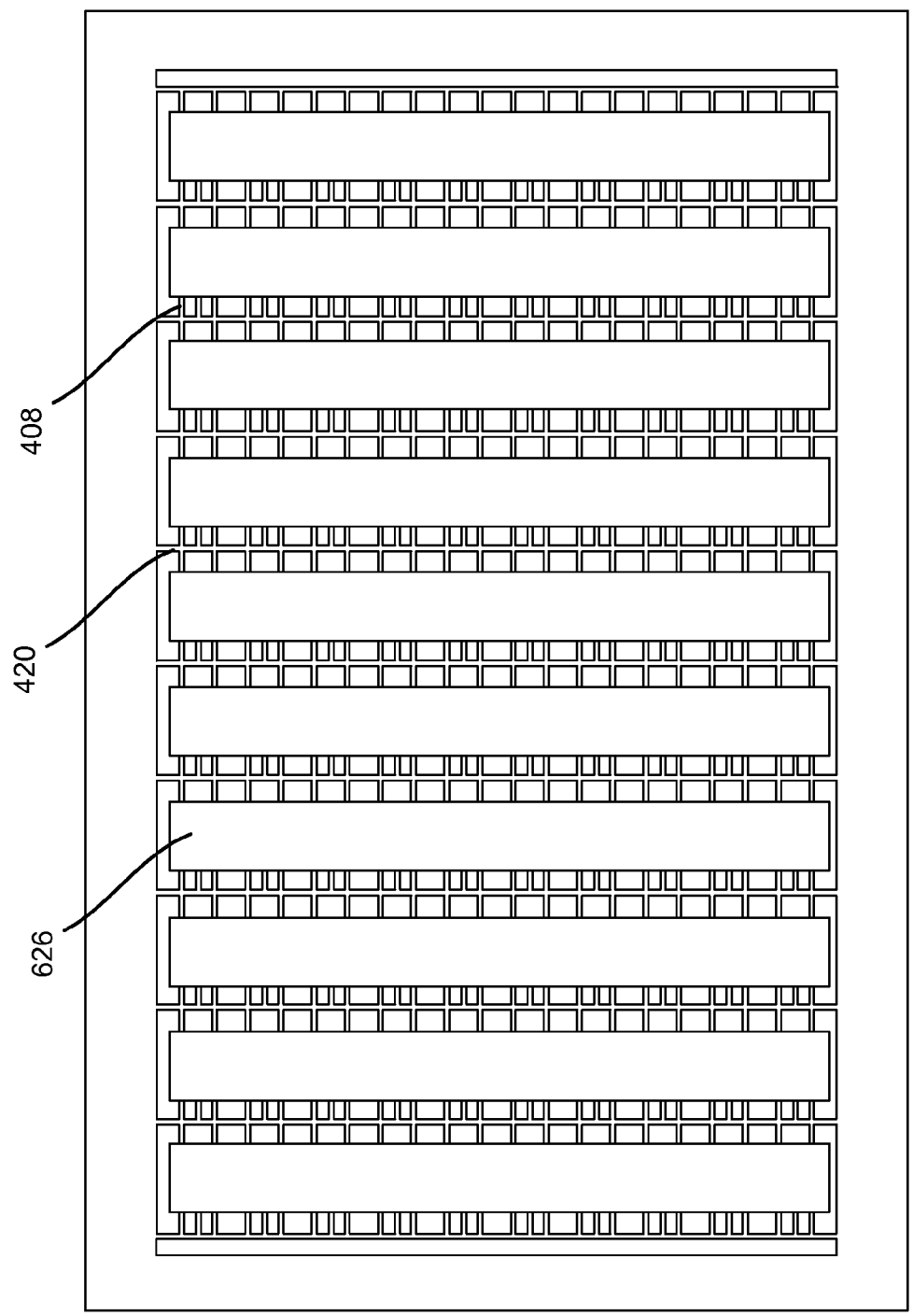
FIG. 6 illustrates a diagrammatic top view of the leadframe panel of FIG. 4 after encapsulation with a molding material in accordance with a particular embodiment of the present invention.

With reference to FIGS. 5 and 6, a process 500 of packaging semiconductor IC dice suitable for use in power applications utilizing the leadframe panel of FIG. 4 will be described. First, a plurality of dice are attached 502 to the leadframe panel. More particularly, the back surface of each die is attached to the top surface of an associated die attach pad 406. By way of example, each die may be adhesively secured to its associated die attach pad 406 with a suitable adhesive tape or epoxy glue. Subsequently, each die is electrically connected 504 to components within its associated device area 404. By way of example, bond pads on the active surface of the die may be electrically connected to top surfaces of associated leads 408. The bonds pads may be electrically connected to the leads 408 with any suitable means. In one embodiment, bonding wires (e.g., gold bonding wires) are used to connect the bond pads to the leads 408.

In particular power applications, it may be desirable for the die to be electrically connected directly to the die attach pad 406. By way of example, the die attach pad 406, itself, may be electrically connected to a contact of a PCB and used as a ground or power supply input. Electrical connection of the die to the die attach pad 406 may be accomplished via bonding wires that electrically connect particular bond pads on the active surface of the die to the support bar 424. In an alternate embodiment, bonding wires may be downbonded (i.e. electrically connected) directly to the die attach pad.

Portions of the populated leadframe panel 400 may then be encapsulated 506 with a conventional molding material. The molding material is generally a non-conductive plastic having a low coefficient of thermal expansion. More particularly, portions of each populated column 402 of device areas 404 are encapsulated substantially simultaneously as illustrated in FIG. 6. In a preferred embodiment, a film assisted molding FAM system may be used to encapsulate the populated leadframe panel. By way of example, in one embodiment a Boschman film assisted molding system is used to encapsulate the populated leadframe panel 400.

Each molding column 626 extends along a majority of the length of the associated column 402 of device areas 404. More particularly, in a preferred embodiment, the molding column 626 should encapsulate the dice, electrical connections, portions of the die attach pads 406 and portions of the leads 408 of all of the device areas 404 of an associated column 402 while not encapsulating the outermost portions of the leads or other portions of the leadframe panel 400. In this way, the amount of molding material required is significantly reduced. It should be noted that the bottom surfaces of the die attach pads 406 and the outer portions of the leads 408 that are parallel with the bottom surfaces of the die attach pads 406 are not encapsulated with molding material. In this way, the bottom surfaces of the die attach pads 406 and outer portions of the leads 408 are left exposed on the bottom surface of the encapsulated device areas 404. It should be appreciated that maximizing the exposed surface area of the die attach pad 406 on the bottom surface of the resultant package enables increased heat dissipation out of the resultant package after singulation.

It should be appreciated, that although each molding column 626 is substantially separate and physically distinct from its neighboring molding columns, all columns 402 of the leadframe panel 400 may be encapsulated substantially simultaneously using a mold having a plurality of molding cavities, each molding cavity being arranged to encapsulate a single column 402 of device areas 404. In this way, all of the device areas 402 of an entire leadframe panel 400 may be encapsulated substantially simultaneously.

After encapsulation, the molding material is subjected to a post mold cure 508. Following the post mold cure 508, the molding material may be laser marked 510. Bottom surfaces of the exposed leads 408 and die attach pad 406 may also be solder plated 512. Solder plating is generally performed to facilitate electrical connection to contacts on a PCB.

Next, the encapsulated leadframe panel 400 may be singulated 514 to produce individual IC packages. Although the encapsulated leadframe panel 400 may be singulated by any suitable means (i.e., sawing, laser cutting or punching), it should be appreciated that the described arrangement of the leadframe panel 400 allows for the use of efficient sawing methods. In a preferred embodiment, the encapsulated leadframe panel 400 is singulated by means of single pass sawing or gang-cutting. Gang-cutting involves the use of a plurality of parallel saw blades to saw the leadframe panel simultaneously. In this way, a plurality of encapsulated columns 402 may be singulated from each other substantially simultaneously. Subsequently, another pass of the gang-cutter may be used to singulate the individual encapsulated device areas (packages) of an associated column 402 from one another. Thus, the use of gang-cutting saws may allow for the singulation of an entire leadframe panel 400 via only two perpendicular saw passes, in contrast to conventional trim methods that punch out only single packages, or single rows of packages, at once. The described leadframe panel and packaging process enables package thicknesses of approximately 0.6 mm (or thinner).

FIGS. 7A-7D illustrate perspective, bottom, front and side views of a package 700 in accordance with particular embodiments of the present invention. The package 700 is produced utilizing particular embodiments of a device area 404 of the leadframe panel 400 described above. It should be noted that the hidden inner components of the package 700, such as the die attach pad 406 and inner portions of the leads 408, are indicated with dotted lines. As illustrated in both FIGS. 7B and 7D, the inner portions of the leads 408 are laterally offset relative to the outer portions of the leads. Additionally, as illustrated in both FIGS. 7C and 7D, the inner portions of the leads 408 are vertically upset relative to the outer portions of the leads.

In one embodiment, the package 700 may have a package footprint that is substantially identical to an SC70 or SOT23 package footprint.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A leadframe panel suitable for use in packaging integrated circuit dice, the leadframe panel comprising:

a two-dimensional array of device areas arranged in a plurality of columns, each column including a plurality of immediately adjacent device areas, each device area configured for use in a semiconductor die power package, wherein each device area includes a plurality of leads and a non-rectangular shaped die attach pad that includes two opposed ends and two opposed sides in which a separation between the two opposed sides varies so that the two opposed sides are spaced farther apart from each other in a middle region than in a region proximate the two opposed ends; and a plurality of intermediate tie bars that extend substantially parallel to the columns of device areas between a pair of associated adjacent columns of device areas, wherein all of the leads and the die attach pads in each intermediate column of devices areas are carried only by a pair of associated intermediate tie bars such that all of the leads and die attach pads in each intermediate column are only supported by the intermediate tie bars free of any horizontal support bars;

wherein each lead bends around one of the opposed ends of the die attach pad and proceeds in a peripheral region along a length of one of the opposed sides towards the middle region of the die attach pad with each lead including at least one bend to form an offset that maintains a desired minimum separation between the die attach pad and the lead along the length of each lead.

2. A leadframe panel as recited in claim 1, wherein each lead includes an inner portion proximal to the die attach pad and an outer portion distal to the die attach pad, wherein each inner portion of at least the outermost leads of the package is vertically upset relative to the associated outer portion of the lead along at least a portion of its length about the periphery the die attach pad such that a top surface of each inner portion is higher than a top surface of the associated outer portion of the lead and higher than the top surface of the associated die attach pad.

3. A leadframe panel as recited in claim 2, wherein bottom surfaces of the outer portions of the leads are substantially coplanar with a bottom surface of the associated die attach pad and a bottom surface of the leadframe panel.

4. A packaging panel comprising:
a leadframe panel as recited in claim 1; and
a plurality of semiconductor integrated circuit dice, each die having an active surface and a back surface, the active surface including a plurality of bond pads, the back surface being substantially opposite the active surface, the back surface of each die being affixed to a top surface of an associated die attach pad in an associated device area.

5. A packaging panel as recited in claim 4, further comprising bonding wires that electrically connect bond pads on the active surface of each die to top surfaces of associated leads.

6. A packaging panel as recited in claim 5, further comprising bonding wires that electrically connect bond pads on the active surface of each die to the associated die attach pad.

7. A leadframe panel as recited in claim 1, wherein at least one of the leads is designated as a high power lead that is configured to carry a power signal having wattages in the range of approximately 0 to 10 W.

8. A packaging panel as recited in claim 1, wherein no horizontal support bars are provided between adjacent device areas in an individual column of device areas.

9. A leadframe panel suitable for use in packaging integrated circuit dice, the leadframe panel comprising:
a two-dimensional array of device areas arranged in a plurality of columns, each column including a plurality of immediately adjacent device areas, each device area configured for use in a semiconductor die power package, wherein each device area includes a plurality of leads and a die attach pad that includes two opposed ends and two opposed sides in which a separation between the two opposed sides varies so that the two opposed sides are spaced farther apart from each other in a middle region than in a region proximate the two opposed ends; and
a plurality of intermediate tie bars that extend substantially parallel to the columns of device areas between a pair of associated adjacent columns of device areas, wherein all of the leads and the die attach pads in each intermediate column of devices areas are carried only by a pair of associated intermediate tie bars; and
wherein each lead includes an inner portion proximal to the die attach pad and an outer portion distal to the die attach pad, the inner portion having a lead tip, wherein each inner portion of at least the outermost leads of the package is laterally offset relative to the associated outer portion of the lead to form lateral offsets such that each outermost lead bends around one of the opposed ends of the die attach pad and proceeds along a length of a periphery of one of the opposed sides of the die attach pad, whereby the inner portions and lead tips of the outermost leads within a particular device area that are located on opposite sides of the associated die attach pad are spaced further apart than the outer portions of the outermost leads within the particular device area and whereby the lateral offsets help maintain a desired separation between the die attach pad and the outermost leads.

10. A packaging panel as recited in claim 9, wherein no support bars are provided between adjacent device areas in an individual column of device areas such that all of the leads and die attach pads in each intermediate column are only supported by the intermediate tie bars.

11. A leadframe panel as recited in claim 9, wherein each inner portion of at least the outermost leads of the package is vertically upset relative to the associated outer portion of the lead along at least a portion of its length about the peripheral region of the die attach pad such that a top surface of each inner portion is higher than a top surface of the associated outer portion of the lead and higher than the top surface of the associated die attach pad.

12. A packaging panel for use in packaging integrated circuit dice, the packaging panel comprising:
a lead frame panel including,
two-dimensional array of device areas arranged in a plurality of columns, each column including a plurality of immediately adjacent device areas, each device area configured for use in a semiconductor die power package, wherein each device area includes a plurality of leads and a non-rectangular die attach pad that includes two opposed ends and two opposed sides in which a separation between the two opposed sides varies so that the two opposed sides are spaced farther apart from each other in a middle region than in a region proximate the two opposed ends, and
a plurality of intermediate tie bars that extend substantially parallel to the columns of device areas between a pair of associated adjacent columns of device areas, wherein all of the leads and the die attach pads in each intermediate column of devices areas are carried only by a pair of associated intermediate tie bars;
a plurality of semiconductor integrated circuit dice, each die having an active surface and a back surface, the active surface including a plurality of bond pads, the back surface being substantially opposite the active surface, the back surface of each die being affixed to a top surface of an associated die attach pad in an associated device area;
bonding wires that electrically connect bond pads on the active surface of each die to top surfaces of associated leads; and
a plurality of distinct, spaced apart columns of molding material, each column of molding material being arranged as a continuous segment that encapsulates at least the dice, bonding wires and inner portions of the leads of all of the device areas in an associated column of device areas while leaving bottom surfaces of the die attach pads and outer portions of the leads exposed on a bottom surface of the encapsulated leadframe panel.

13. A packaging panel as recited in claim 12, wherein no support bars are provided between adjacent device areas in an individual column of device areas such that all of the leads and die attach pads in each intermediate column are only supported by the intermediate tie bars.

14. A packaging panel as recited in claim 12, wherein each lead includes an inner portion proximal to the die attach pad and an outer portion distal to the die attach pad, wherein each inner portion of at least the outermost leads of the package is vertically upset relative to the associated outer portion of the lead along at least a portion of its length about a periphery of the die attach pad such that a top surface of each inner portion is higher than a top surface of the associated outer portion of the lead and higher than the top surface of the associated die attach pad.

15. A packaging panel as recited in claim 12, wherein each lead bends around one of the opposed ends of the die attach pad and proceeds in a peripheral region along a length of one of the opposed sides towards the middle region of the die attach pad with each lead including at least one bend to form an offset that maintains a desired minimum separation between the die attach pad and the lead along the length of each lead.

16. An integrated circuit package, comprising:
- a semiconductor integrated circuit die, the die having an active surface and a back surface, the active surface including a plurality of bond pads, the back surface being substantially opposite the active surface;
- a die attach pad, the die attach pad having a top surface and a bottom surface, the back surface of the die being affixed to the top surface of the die attach pad, the die attach pad including two opposed ends and two opposed sides in which a separation between the two opposed sides varies so that the two opposed sides are spaced farther apart from each other in a middle region than in a region proximate the two opposed ends;
- a plurality of leads, each lead having an inner portion proximal to the die attach pad and an outer portion distal to the die attach pad, wherein each inner portion of at least the outermost leads of the package is vertically upset relative to the associated outer portion of the lead along a portion of its length about a periphery of the die attach pad such that a top surface of each inner portion is higher than a top surface of the associated outer portion of the lead and higher than the top surface of the associated die attach pad, wherein each inner portion of at least the outermost leads of the package is laterally offset relative to the associated outer portion of the lead such that each outermost lead bends around one of the ends of the die attach pad to one of the sides of the die attach pad and proceeds a length along the side of the die attach pad, and wherein bottom surfaces of the outer portions of the leads are substantially coplanar with the bottom surface of the die attach pad, whereby the lateral offset help maintain a desired minimum separation between the die attach pad and the outermost leads;
- electrical connections that electrically connect bond pads of the die to top surfaces of the inner portions of the leads; and
- molding material that encapsulates portions of the die, die attach pad, leads and electrical connections while leaving the bottom surface of the die attach pad and bottom surfaces of the outer portions of the leads exposed through the molding material on a bottom surface of the package, wherein the vertical upset and lateral offset of the outermost leads cooperate with the molding material to provide locking features that help secure the outermost leads within the package.

17. An integrated circuit package as recited in claim 16, wherein at least one of the leads is designated as a high power lead that is configured to carry a power signal having wattages in the range of approximately 0 to 10 W.

18. An integrated circuit package as recited in claim 16, wherein the electrical connections are bonding wires.

19. An integrated circuit package as recited in claim 16, further comprising bonding wires that electrically connect bond pads on the die to the die attach pad.

20. An integrated circuit package as recited in claim 16, wherein the package thickness is less than or substantially equal to 0.6 mm.

* * * * *